United States Patent
Mansfield

(10) Patent No.: US 7,030,610 B2
(45) Date of Patent: Apr. 18, 2006

(54) ACTIVE ACOUSTIC CONTROL WITH FLEXIBLE JOINTS IN GRADIENT COIL DESIGN FOR MRI

(76) Inventor: Peter Mansfield, 68 Beeston Fields Drive, Bramcote, Nottingham, NG9 3DD (GB)

( * ) Notice: Subject to any disclaimer, the term of this patent is extended or adjusted under 35 U.S.C. 154(b) by 0 days.

(21) Appl. No.: 10/221,935

(22) PCT Filed: Mar. 16, 2001

(86) PCT No.: PCT/GB01/01150

§ 371 (c)(1),
(2), (4) Date: Feb. 10, 2003

(87) PCT Pub. No.: WO01/69278

PCT Pub. Date: Sep. 20, 2001

(65) Prior Publication Data

US 2003/0155174 A1    Aug. 21, 2003

(30) Foreign Application Priority Data

Mar. 17, 2000 (GB) .................................... 0006356

(51) Int. Cl.
*G01V 3/00* (2006.01)
*H01F 7/06* (2006.01)
(52) U.S. Cl. ..................................... 324/318; 29/602.1
(58) Field of Classification Search ........ 324/318–322; 600/410, 422; 181/207
See application file for complete search history.

(56) References Cited

U.S. PATENT DOCUMENTS 5,276,398 A * 1/1994 Withers et al. ............. 324/318
5,351,007 A * 9/1994 Withers et al. ............. 324/322
5,565,778 A * 10/1996 Brey et al. .................. 324/318

(Continued)

FOREIGN PATENT DOCUMENTS

WO    WO96/31785    * 10/1996

OTHER PUBLICATIONS

"Sound Generation in Gradient Coil Structures for MRI" by Mansfield et al., Magnetic Resonance in Medicine vol. 39 pp. 539-550 1998. (submitted by applicant).*

(Continued)

*Primary Examiner*—Diego Gutierrez
*Assistant Examiner*—Tiffany A. Fetzner
(74) *Attorney, Agent, or Firm*—Kilpatrick Stockton LLP

(57) ABSTRACT

A method of producing an acoustically quiet coil design comprising first inner and outer surface conductor portions on a first block of material and second inner and outer surface conductor portions on a second block of material and including forming said portions of said each of said inner and outer surface conductor portions to be substantially completely rigid and connecting said inner surface conductor portion of said first block to said inner surface conductor portion of said second block and said outer surface conductor portion of said first block to said outer surface conductor portion of said second block by columns, struts or ties to form a substantially rigid structure.

7 Claims, 11 Drawing Sheets

U.S. PATENT DOCUMENTS

Figure 1:
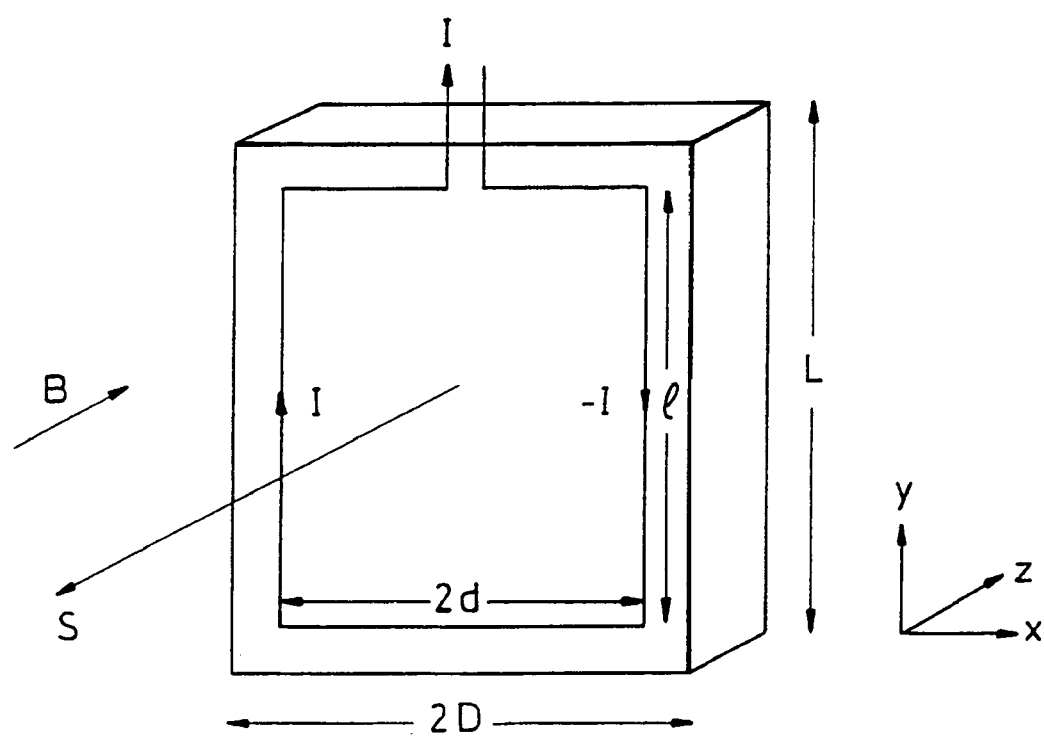

| | | | | |
|---|---|---|---|---|
| 5,594,342 | A * | 1/1997 | Brey et al. | 324/322 |
| 5,619,140 | A * | 4/1997 | Brey et al. | 324/318 |
| 5,708,362 | A * | 1/1998 | Frese et al. | 324/319 |
| 5,764,059 | A * | 6/1998 | Mansfield et al. | 324/318 |
| 5,990,680 | A * | 11/1999 | Mansfield | 324/318 |
| 6,441,616 | B1 * | 8/2002 | Mansfield | 324/318 |
| 6,456,074 | B1 * | 9/2002 | Minas | 324/318 |
| 6,519,343 | B1 * | 2/2003 | Mansfield | 381/71.1 |
| 6,661,229 | B1 * | 12/2003 | Weyers et al. | 324/318 |
| 2002/0169374 | A1 * | 11/2002 | Jevtic | 600/422 |
| 2002/0180439 | A1 * | 12/2002 | Lee | 324/318 |
| 2003/0155174 | A1 * | 8/2003 | Mansfield | 181/207 |

OTHER PUBLICATIONS

Mansfield, P., et al.: Sound Generation in Gradient Coil Structures for MRI,: *Magnetic Resonance in Medicine*, US, Academic Press, Duluth, MN.

* cited by examiner

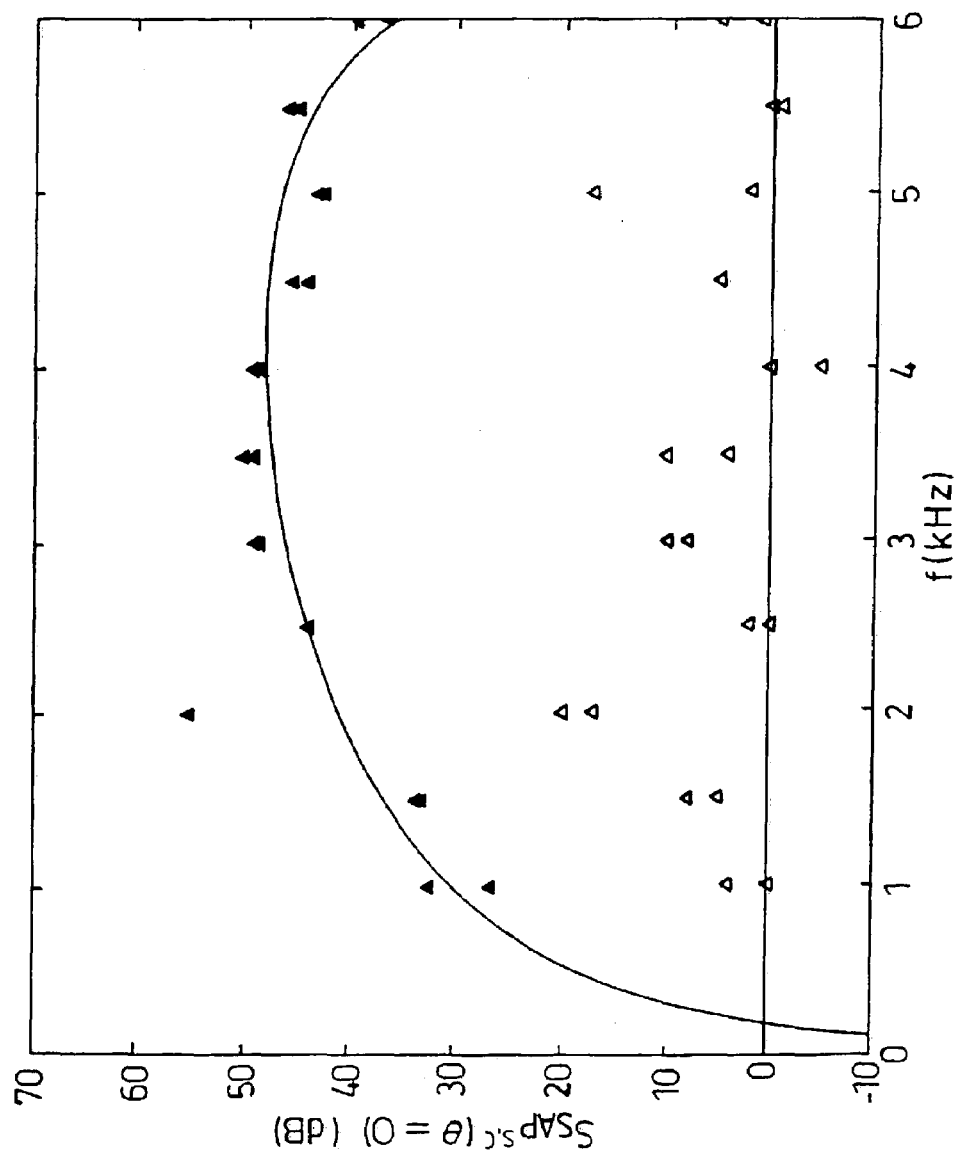

ALIGNED FIBRE COMPOSITE (EPOXY / SINGLE GLASS FIBRE BUNDLES OR EPOXY / SINGLE CARBON FIBRE BUNDLES)

ALIGNED FIBRE COMPOSITE

ALIGNED FIBRE COMPOSITE

ALIGNED FIBRE COMPOSITE

ALIGNED FIBRE COMPOSITE

ACTIVE ACOUSTIC CONTROL WITH FLEXIBLE JOINTS IN GRADIENT COIL DESIGN FOR MRI

CROSS-REFERENCE TO RELATED APPLICATIONS

The present patent application claims priority to PCT/GB01/01150, PCT publication number WO/01/69278 A1, filed Mar. 16, 2001, which claims priority to GB 0006356.0, filed Mar. 20, 2000, now terminated.

The present application relates to acoustically quiet gradient coil design in magnetic resonance imaging (MRI).

The design of gradient coils for MRI has traditionally ignored the acoustic noise output generated by such structures when placed in a strong magnetic field. The Lorentz forces at the wires induce vibrational modes in the coil structures which in turn couple to the surrounding air generating substantial noise. The situation is exacerbated in ultra-high-speed imaging such as EPI and EVI because of the very high switching rates used in these techniques. Noise levels can be as high as 130 dB which is well above the safety levels permitted in factories and in the workplace. Various approaches to ameliorate the problem have been proposed including localised noise cancellation with headphones and Lorentz force balancing (P. Mansfield, P. Glover, R. Bowtell, Active Acoustic Screening: Design Principles for Quiet Gradient Coils in MIR. Meas. Sci. Technol. 5, 1021–1025 (1994)), but none of these approaches is satisfactory. For example, with Lorentz force balancing only a 10 dB reduction is achievable at 1.0 kHz. In the prior art (P. Mansfield, U.S. Pat. No. 5,990,680, Nov. 23, 1999, Priority Date Apr. 1, 1995) the principle of active acoustic control was introduced and shows great promise in reducing acoustic noise emitted from MRI gradient coils. Study of the fundamental processes of noise generation in rigid support systems (P. Mansfield, P Glover, J Beaumont, Sound Generation in Gradient Coil Structures for MRI. Magn. Reson. Med 39, 539–550 (1998)) has led to a better understanding of the acoustic noise generation process. In the present work the theoretical framework for active acoustic control has been extended and new expressions for the expected noise reduction derived. From these results, new practical embodiments of the principles of active acoustic control are suggested which may produce more robust operation in the acoustic cancellation mode by significantly reducing residual acoustic radiation from the edges of the plate assembly.

The new principles of active acoustic control in gradient coil design described in the prior art (P Mansfield, U.S. Pat. No. 5,990,680, Nov. 23, 1999, Priority Date Apr. 1, 1995) are explored further and theoretical expressions are developed for the far field acoustic output for a coil system using the principle and comprising four or more flat rectangular coil sectors. Each sector consists of a split plate arrangement in which are embedded two windings, an outer primary winding and a narrow inner re-entrant loop control winding immediately adjacent to and surrounding the split or air gap. The wire spacing of the control winding is made small so as not to affect substantially the magnetic field created by the primary winding.

Experimental results are produced for one sector made from GRE 10G/40 (Tuffol) which show an average difference in acoustic output of 34.9 dB when the control winding is appropriately driven at 3.2 kHz. New theoretical expressions are developed which include longitudinal as well as transverse plate characteristics and are used to fit experimental output data as a function of frequency and indicate good agreement with regard to the form of the output responses.

Detailed transverse response expressions are derived from particular frequencies based on normal mode expansions for the plate. New detailed expressions are derived for the amplitude ratio of acoustic output in the additive and cancellation modes. This in turn has led to a novel plate design and to wire layout modifications which bring about acoustic cancellation along both plate axes.

It is an object of the present invention to provide an improved quiet coil design.

A method of producing an acoustically quiet coil design comprising first inner and outer surface conductor portions on a first block of material and second inner and outer surface conductor portions on a second block of material and including forming said portions of said each of said inner and outer surface conductor portions to be substantially completely rigid and connecting said inner surface conductor portion of said first block to said inner surface conductor portion of said second block and said outer surface conductor portion of said first block to said outer surface conductor portion of said second block by columns, struts or ties to form a substantially rigid structure.

The present invention also provides an acoustically quiet coil design for MRI including a magnetic coil system comprising a first outer coil loop carrying a first current and a second inner coil loop carrying a second current at least a first portion of the first outer coil loop and a portion of the second inner coil loop being embedded in or fixed to a first block of first material of generally rectangular or arcuate shape with predetermined acoustic characteristics and at least a second portion of the first outer coil loop and a second portion of the second inner coil loop being embedded in or fixed to a second block of said first material generally of rectangular or arcuate shape with predetermined acoustic characteristics, said first and second blocks of material being separated by a second material which could be air and in which said first and second coils comprise a generally rectangular or arcuate path and in which at least the second portion of said inner coil is positioned to create a force when energized with said first and second currents appropriately phased either to counter or to assist the force generated by said first portion of said outer coil on at least two opposite sides of each of said blocks said forces being transmitted by columns, struts or ties and in which each portion of each coil comprises a corresponding conductor portion and in which the conductor portion forming the first portion of the first outer coil loop and the opposing second portion of the second inner coil loop is formed to be substantially rigid and in which said stiffened conductor portions are rigidly attached by said columns, struts or ties to form a substantially rigid structure.

In a preferred embodiment said stiffened conductor portions are formed from a shaped conductor formed in combination with a shaped non conducting material.

The present invention also provides a method of providing an acoustically quiet coil design for MRI including a magnetic coil system consisting of at least four sectors each sector comprising a first outer coil loop carrying a first current and a second inner coil loop carrying a second current at least a first portion of the first outer coil loop and a first portion of the second inner coil loop being embedded in or fixed to a first block of first material of generally rectangular or arcuate shape with predetermined acoustic characteristics and at least a second portion of the first outer coil loop and a second portion of the second inner coil loop being embedded in or fixed to a second block of said first material generally of rectangular or arcuate shape with predetermined acoustic characteristics, said first and second blocks of material being separated by a second material which could be air and in which said first and second coils comprise a generally rectangular or arcuate path and in which at least the second portion of said inner coil is positioned to create a force when energized with said first and second currents appropriately phased either to counter or assist the force generated by said first portion said outer coil on at least two sides of each of said blocks said forces being transmitted by columns, struts or ties and in which each portion of each coil comprises a corresponding conductor portion and in which the conductor portion forming the first portion of the first outer coil loop and the opposing second portion of the second inner coil loop is formed to be substantially rigid and in which said stiffened conductor portions are rigidly attached by said columns, struts or ties to form a substantially rigid structure.

Preferably the wave propagation at a distance x within the first material is described by $$F(x, k) = \sin kx = \sum_{n}^{\infty} a_n \sin(n\pi x/d),$$

for the case where $\emptyset \approx \pi$, and $$G(x, k) = \cos kx = \sum_{m}^{\infty} b_o + b_m \cos(m\pi x/d),$$

for the case $\emptyset \approx 0$, where n=1,3 5 . . . , m=2,4,6 . . . , and where the coefficients are given by $$a_n = \frac{-2dk\cos(dk/2)}{d^2k^2 - n^2\pi^2}$$

and $$b_m = \frac{-2dk\sin(dk/2)}{d^2k^2 - m^2\pi^2}$$

where k is the wave propagation constant in the solid material, d is the distance travelled by the wave in the material, $b_0$=sinc(kd/2) and Ø is the relative phase of the first and second currents in the outer and inner conductors respectively.

In a preferred embodiment the approximate reduction in acoustic noise output is described by $R=b_2/a_1$ and in which when the columns, struts or ties are introduced the new ratio of reduced to full acoustic output in the block of first material is given by $R'=\alpha b_2/a_1$ where the effective force on each block edge is given by $F'=\alpha F$ where $0 \leq \alpha \leq 1$ and where F is the Lorentz force created by the conductor when energized with no columns, struts or ties present.

Figure 2:
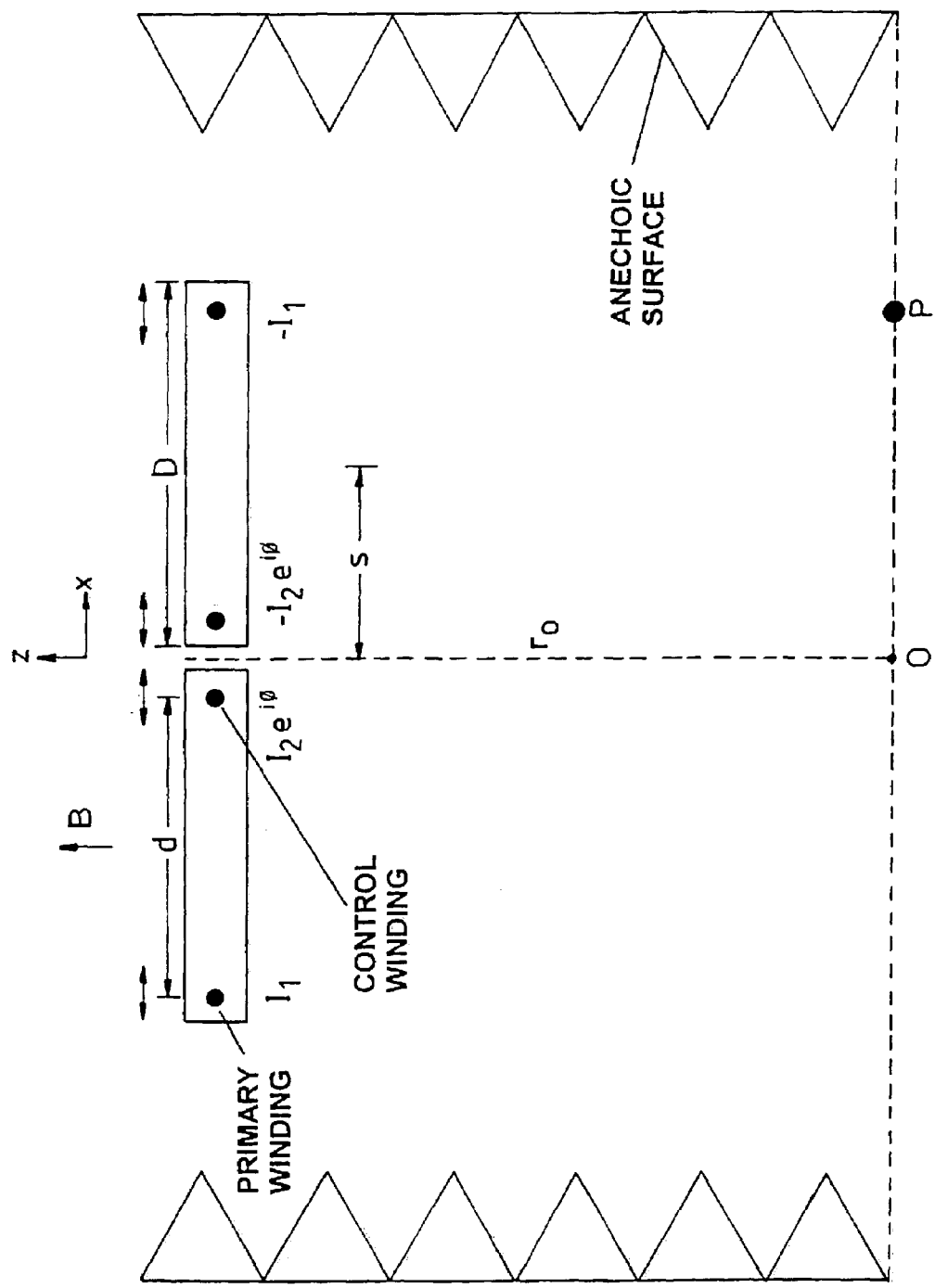
Figure 3A:
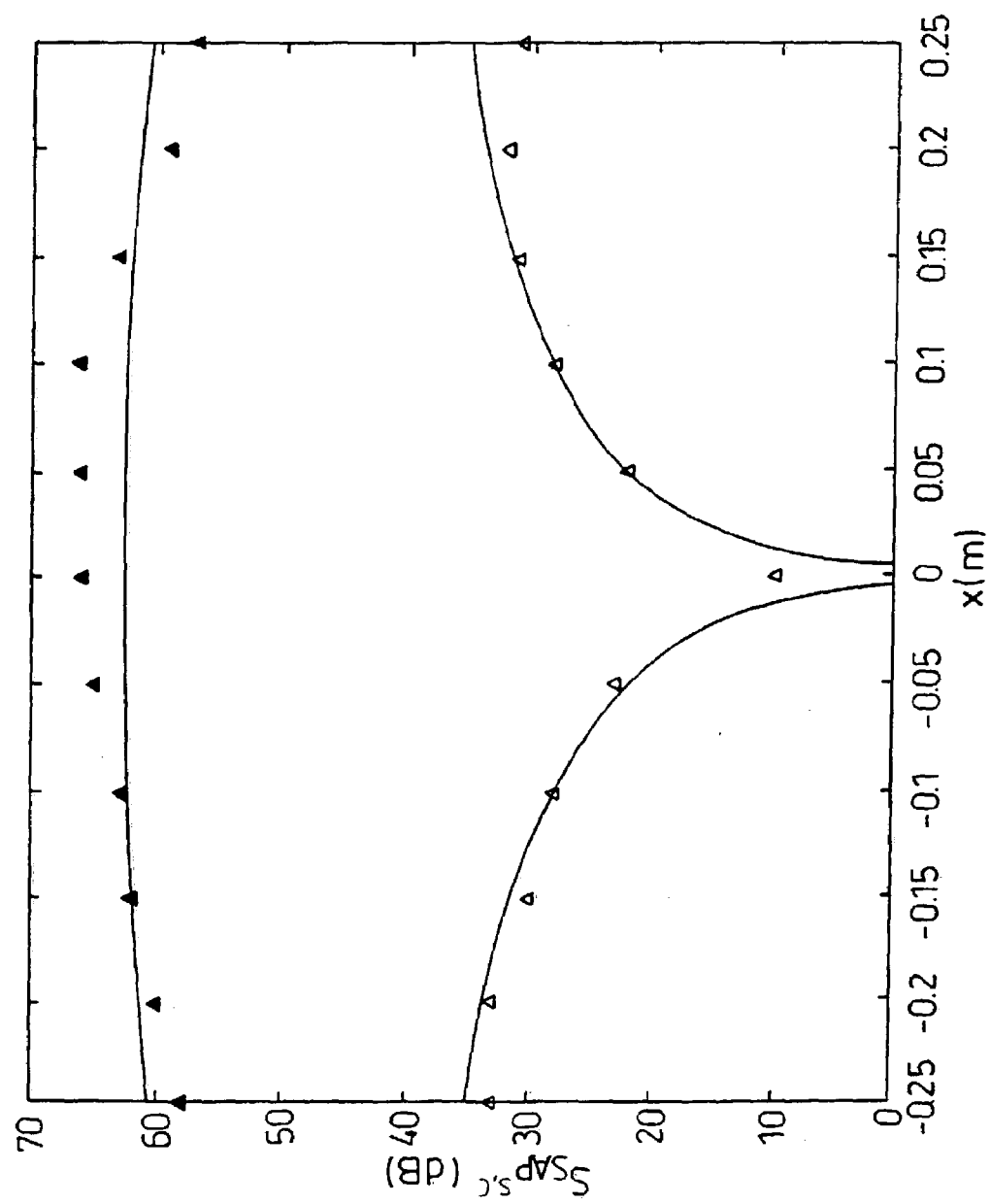
Figure 3B:
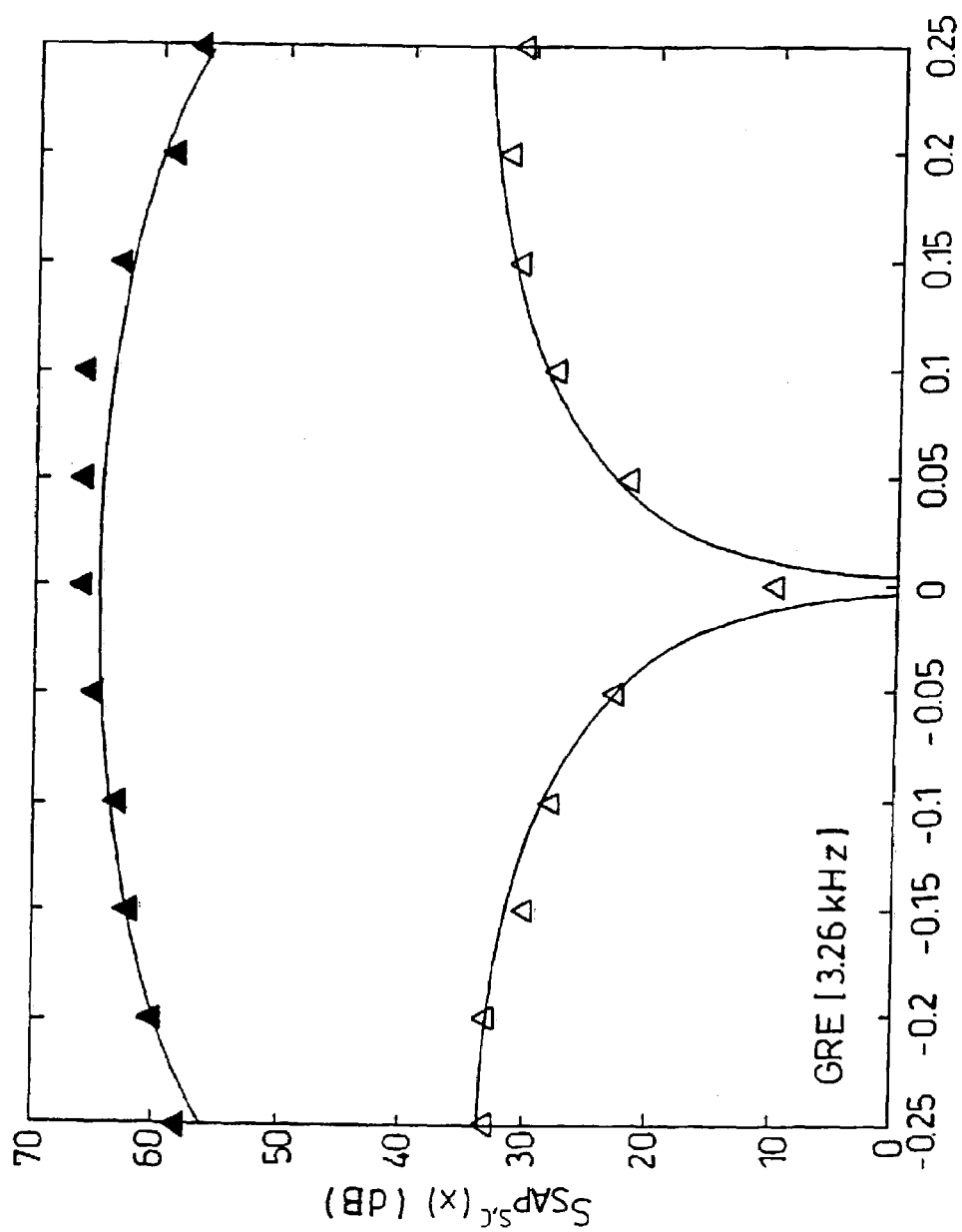

Embodiments of the present invention will now be described, by way of example with reference to the accompanying drawings, in which:

FIG. 1 is a sketch of a flat rectangular wire loop of width 2d and length l carrying a current I. The loop is embedded in a block of material of width 2D and length L with the loop plane normal to the magnetic field B. Sound S is emitted along the z-axis;

FIG. 2 is a diagram showing a plan view of a split plate arrangement suspended in an anechoic chamber. Each half of the plate pair has a width D. Embedded in each block are two conductors with separation d. The plate centres are displaced from the assembly origin by ±s. The outer pair comprise the primary winding carrying current $I_1$. The inner pair comprise the control winding carrying current $$I_2 e^{i\phi}$$

where $\phi$ is the relative phase difference of the two currents. A microphone is moved along the line O-P to record the data. The distance $r_0$=1.2 m;

FIG. 3 shows (a) Graph of acoustic response data $S_{SAP}{}^{s,}$ $_c$(dB) versus x for the arrangement of FIG. 2. The closed triangles correspond to $S_{SAP}{}^c$ versus x with $\phi \cong \pi$ and the open triangles correspond to $S_{SAP}{}^s$ versus x, i.e. the control winding on with phase $\phi$ optimised at $\phi \cong 0$ to reduce the output signal. The solid curves are the fitted theoretical expressions, Eq. [7]. The peak-peak currents used were $I_1$=20 A and $I_2$=19 A. The plate material was GRE 10G 40 (Tuffnol); (b) Graph of acoustic response data as in FIG. 3(a) above. The solid curves are the new theoretical expressions based on the normal mode expansions, Eqns.[12] and [13] and Eqn. [50] with $$A_{SAP}^s = 0;$$

Figure 4B:
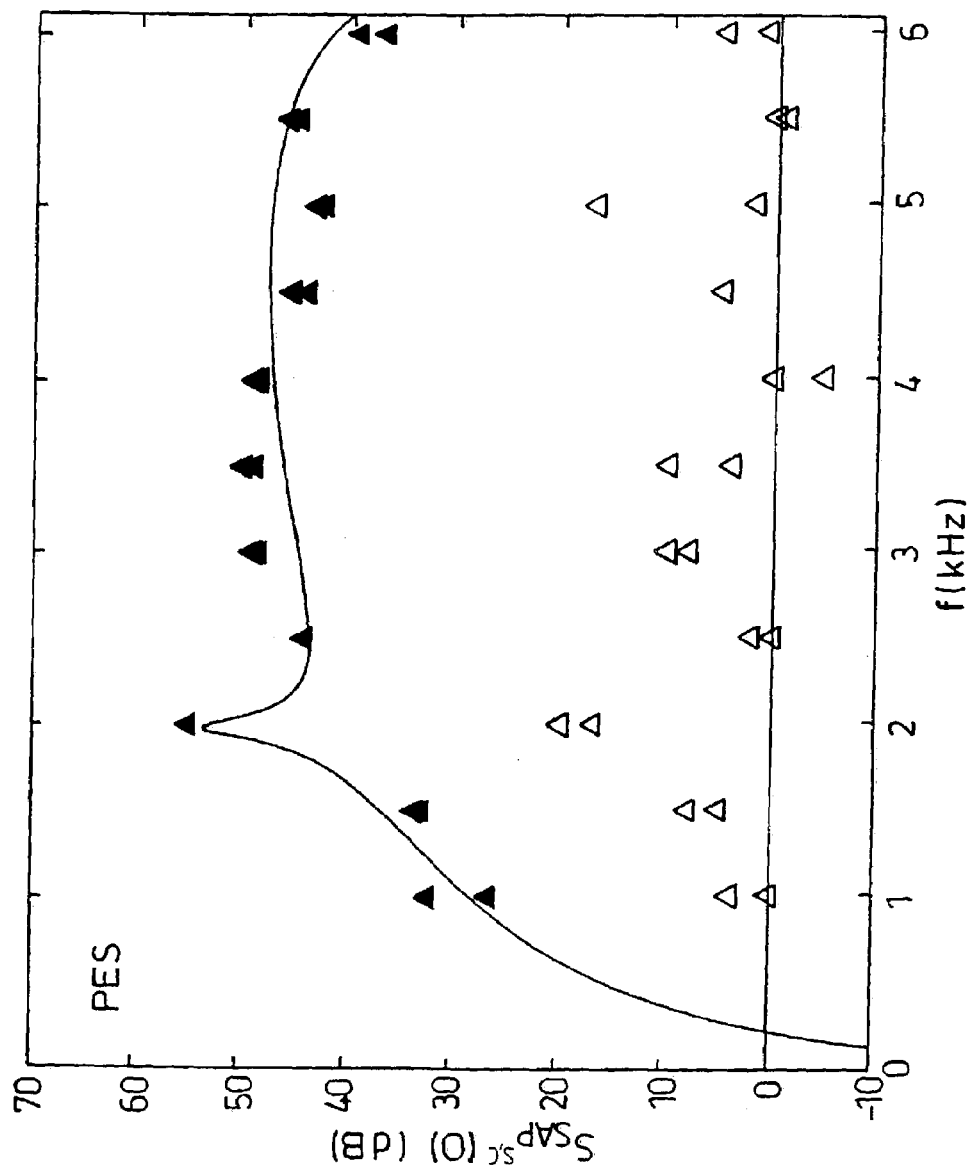

FIG. 4(a) Graph of acoustic response $S_{SAP}{}^{s,c}(\theta=0)$ versus f for the arrangement of FIG. 2 but with the microphone fixed at point O. The peak currents used were $I_1$=$I_2$=10 A. The closed triangles correspond to $S_{SAP}{}^c(\theta=0)$ versus f and the open triangles correspond to $S_{SAP}{}^s(\theta=0)$ versus f, i.e. the control winding on with phase $\phi$ optimised at each point to minimise the sound output. The solid curves are the theoretical expressions, Eq.(11). The plate material is 12 mm thick cast polyester/styrene sheet; (b) Graph of acoustic response data as is FIG. 4(a) above. The solid curves are the improved theoretical expressions based on the normal mode theory and Eq. [50] and $$A_{SAP}^s = 0;$$

Figure 5:
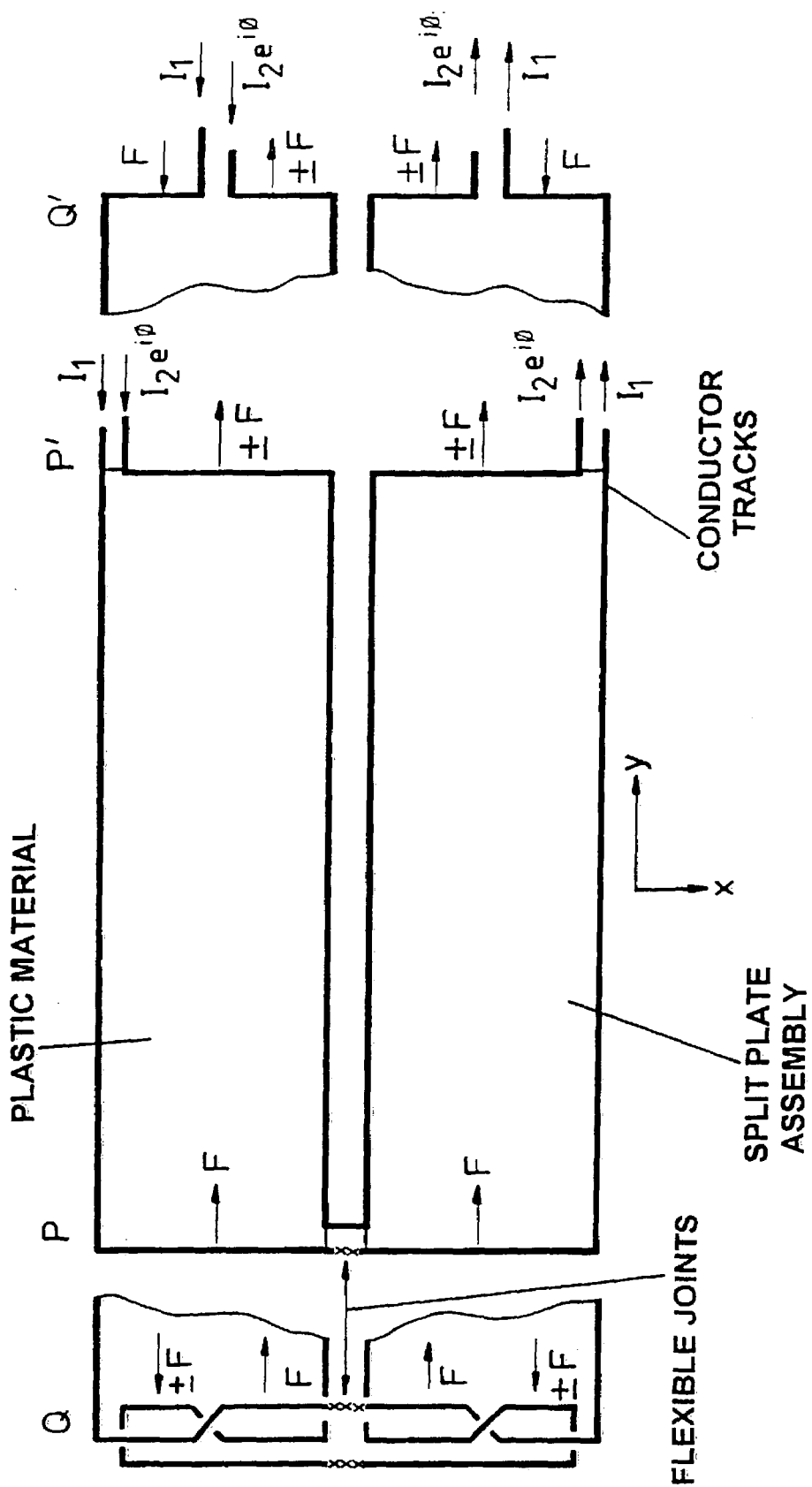
Figure 6:
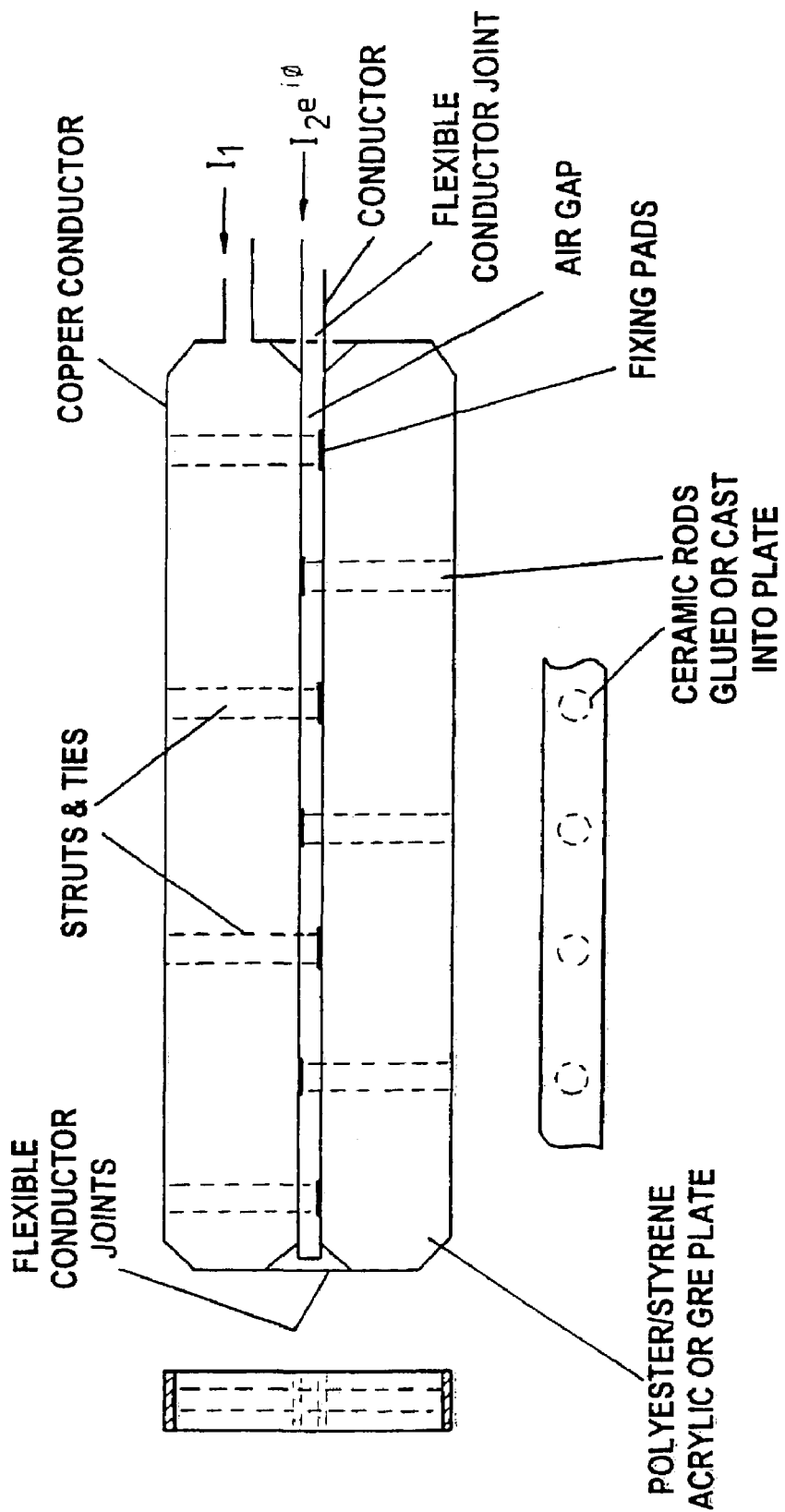
Figure 7:
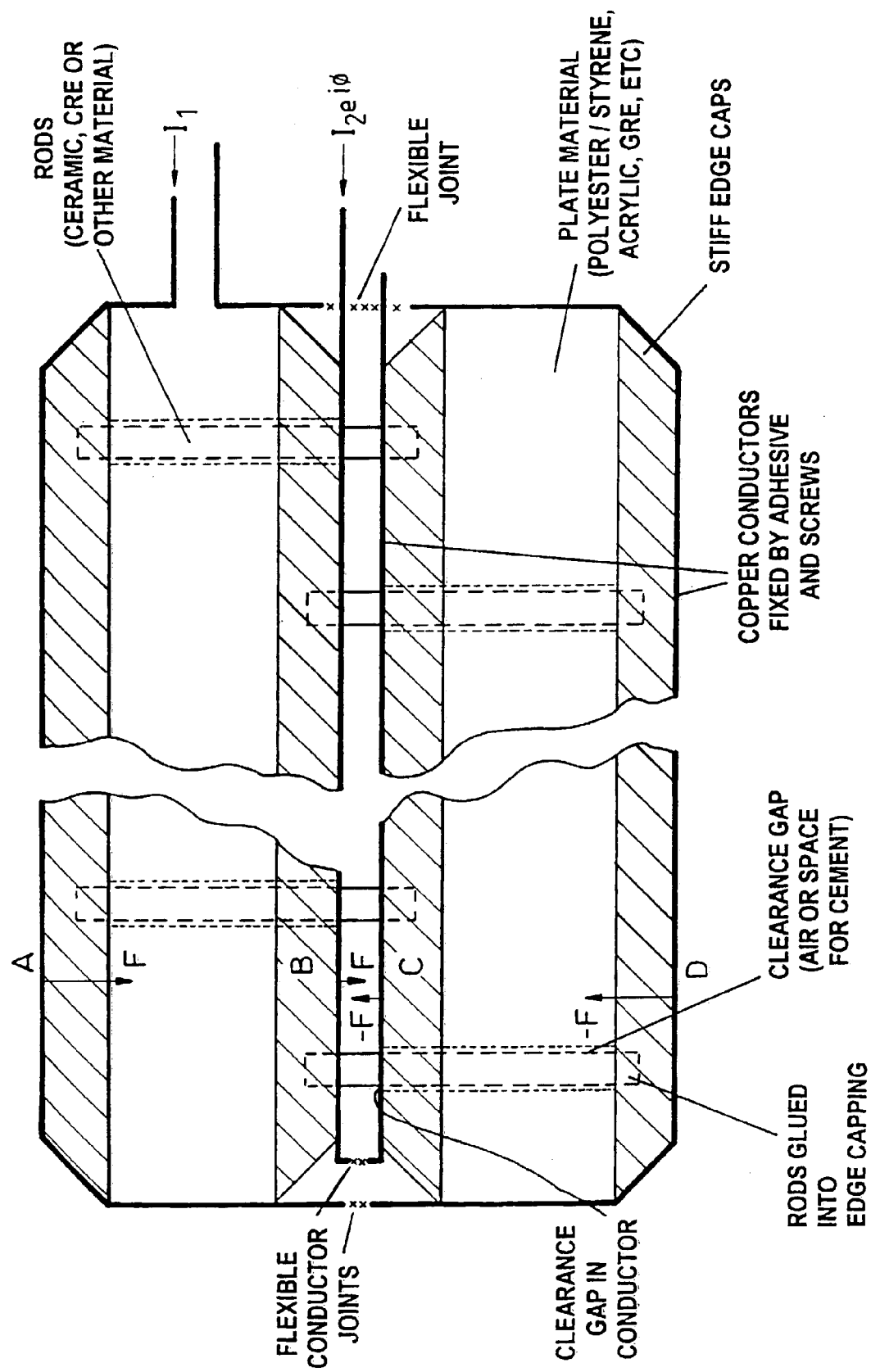
Figure 8:
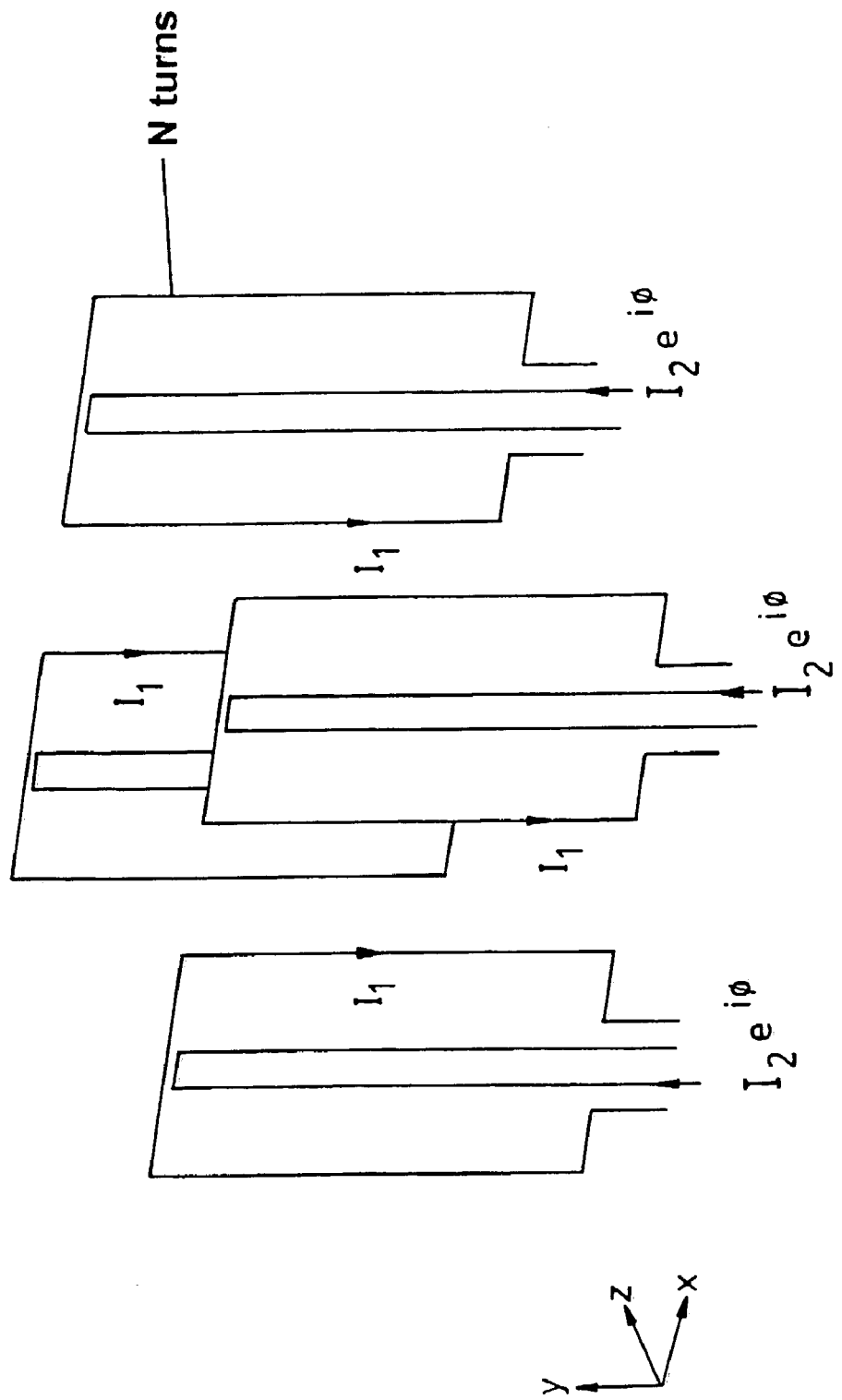

FIG. 5 is a sketch showing two improved wiring arrangements for a plate pair which, in cancellation mode, ie ø=0 and $I_1 \approx I_2$, quenches the n=1 vibrational modes along both the x- and y-axes. The first version P,P' shows the inner loop extended to cover the ends P' producing cancellation or addition along the y-axis as well as normal operation along the x-axis. Each plate may comprise a flat rectangular plate or an arcuate shaped rectangular plate. The arrangement Q,Q' substitutes for P,P' and again produces either cancellation or addition along the y-axis but in a symmetric manner which balances Lorentz forces along the y-axis;

FIG. 6 is a diagram showing the strut/tie assembly of supporting columns within the split plate assembly. In this arrangement the columns are glued within the plate material and touch the outward current, $I_1$, conductor at one end and the return current, $I_2$, conductor in both halves of the plate assembly. The coupling of the rods to the inner loop conductor may include a small pad which also acts as a load spreader. This leads to an inter-digitation effect. The rods or columns may also be potted within the plate assembly;

FIG. 7 is a sketch of an alternative arrangement for the inter-digitated strut/tie assembly. In this arrangement each half of the plate assembly is made from a low acoustic velocity plastic material, the long edges of which are capped with a thin strip of a much stiffer material. The inter-digitated rods pass through the plastic body of the plate and are fixed at each end in the capping strips as shown. In one embodiment, the rods do not touch the plate material but pass through the body of the plate and through one edge capping to make contact with the edge cap of the second half of the plate assembly immediately adjacent to the gap. In this way forces are balanced in the cancellation mode but do not squeeze the plate, whereas in the additive mode each half of the plate assembly is squeezed under the action of equal and opposite Lorentz forces. In another embodiment the rods are either cemented to the body of the plate or are potted into the plate when it is cast;

FIG. 8 is a diagram of a four sector gradient coil for generation of either an x-,y- or a z-gradient. Each sector comprises a split plate coil as in FIG. 2. The inner coil or control winding of each sector carries a current $I_2 e^{i\phi}$ and forms a re-entrant loop within the primary winding which carries a current $I_1$. NB the sector spacing for a z-gradient will in general be different to that for an x- or y-gradient.; and FIGS. (9a–f) shows a number of plate edge stiffening arrangements in which either the conductor itself is shaped or the edge is stiffened with aligned fibre composites and on which the conductor is added.

2. BASIC THEORY

In a previous publication (P. Mansfield, P Glover, J Beaumont, Sound Generation in Gradient Coil Structures for MRI. Magn. Reson. Med 39, 539–550 (1998)) we developed the necessary theory for the acoustic output generated by a wire loop carrying a current, I, embedded in a rectangular plate placed normal to a magnetic field B, see FIG. 1. For a loss-less plate we used Fraunhofer diffraction to calculate the far field sound output amplitude $A_{SAP}$ in air at point P, a distance $r_o$ from the plate when the wave excitation within the plate is of the form sinkx. This is given by $$A_{SAP} = ie^{i(\omega t + jr_o + k\bar{d})} \times a[\mathrm{sinc}\{(j\sin\theta - k)\bar{d}\} + \mathrm{sinc}\{(j\sin\theta + k)\bar{d}\}]. \quad [1]$$

The quantities used in Eq. [1] are given by $$a = \frac{\bar{d}\sigma\pi k F_m \omega}{2 r_o \omega_o^2} \quad [2]$$

in which $F_m$ is the Lorentz force applied to the plate edges (proportional to current, I), $\sigma$ is Poisson's ratio, $2_\tau$ is the plate thickness, 2D is the plate width, 2d is the wire spacing and $\bar{d}=d+D$. The angular frequency $\omega=2\pi f$ in which f is the modulation frequency of the applied current, I, and $\omega_0$ is the natural plate resonance angular frequency, where we assume that $\omega_0 \gg \omega$. The other terms in Eq. [1] are defined as follows: the propagation constant in air, j, is given by $$j = \frac{2\pi f}{v_a} \quad [3]$$

where $v_a$ is the velocity of sound in air. The propagation constant in the solid, k, is given by $$k = \frac{2\pi f}{v_s} \quad [4]$$

where $v_s$ is the compressional wave velocity in the solid.

This is the case for the far field which we further explore here. For near field calculations an alternative approach based on Fresnel or some other diffraction model must be used.

3. Active Acoustic Control

The basic idea behind active acoustic control in gradient coils is to introduce in an appropriate manner additional windings in the coil so as to effectively quench certain vibrational modes within the solid structure thereby reducing sound output from the structure but without compromising the magnetic efficacy of the gradient set. In order to understand the basic mechanism we consider the rectangular plate arrangement of FIG. 2. Here we split the plate of FIG. 1 into two halves, each of width D separated by a small air gap. An additional control winding carrying current $I_2 e^{i\emptyset}$ is added either side of the air gap forming a re-entrant loop within the outer loop which carries current $I_1$. The wire spacing within each half plate is d and the mean effective plate width $\bar{d}=\frac{1}{2}(d+D)$. The use of rectangular plates makes the theory of wave propagation within the solid plate much easier to handle. The plates themselves are fabricated from suitable reinforced plastic laminates such that the wave propagation velocity within is the material is high, typically around 2.5 kms$^{-1}$. The materials have very low losses and these factors simplify the theoretical approach.

We now develop the far field theory for acoustic output from the plate surfaces for the split plate arrangement of FIG. 2. In this far field calculation we assume that the plate is infinitely long conforming to effectively a plane strain situation. As with Eq. [1] the calculation is performed in free space, that is to say, there are no reflections from local objects which would complicate the calculation. In practice we place the gradient plate structure in an acoustic chamber lined with sculpted acoustically absorbent foam material so as to obviate surface reflections. We concentrate on the signal arriving at some distant point P which in general will be displaced from the central axis with an angular displacement θ. If the distance from O to the plate surface, $r_o$, is large enough then phase changes associated with displacements can be ignored. In this situation we apply two currents, $I_1$, which is the outer loop current and $I_2 e^{i\emptyset}$ which is the inner loop current applied with a phase Ø relative to $I_1$. Ignoring constant phase shift terms the acoustic output amplitude from the face of the plate structure, after some algebra, is given by $$A_{SAP}^{s,c} = (y_{s,c}^+ + y_{s,c}^-) \quad [5]$$

for wave excitation within the plate of the form sin kx or cos kx and where $$y_{s,c}^+ -= a_{s,c} \frac{\sin(\overline{d}(j\sin\theta \pm k)/2)}{\overline{d}(j\sin\theta \pm k)/2} \times \frac{\sin}{\cos}\{s(j\sin\theta \pm k)\} \quad [6]$$

and the modulus sound level in decibels is $$S_{SAP}^{s,c} = 20\log|A_{SAP}^{s,c}| \quad [7]$$

The superscripts, s,c, refer to the sine or cosine versions respectively and also correspond respectively to $\phi=0$ and $\phi=\pi$. We note from Eqs.[5] and [6] that when $\phi$ is zero and sk≪1, the acoustic amplitude, $A_{SAP}^{s,c}(\theta=0)$, received at point O' reduces to $$A_{SAP}^s(\theta=0) = 0 \quad [8]$$

and $$A_{SAP}^c(\theta=0) = b_c f \sin(\overline{d}k/2)\cos(sk) \quad [9]$$

where, for $\omega \ll \omega_o$ $$b_c = \frac{2\pi\tau\sigma F_m}{r_o \omega_o^2}. \quad [10]$$

The variable, s, used in Eqs. [6] and [9] is the displacement of the plate centres from the plate assembly origin, as indicated in FIG. 2. The modulus sound level in decibels is therefore $$S_{SAP}^{s,c}(\theta=0) = 20\log|A_{SAP}^{s,c}(\theta=0)|. \quad [11]$$

4. Results

Experimental results from a single plate pair made of glass-reinforced epoxy laminate are plotted in FIG. 3. The filled triangles correspond to a relative phase, $\phi \approx 190°$ while the open triangles correspond to $\phi \approx 10°$. The currents $I_1$ and $I_2$ are respectively 20 and 19 A(p.p) and the number of turns for both inner and outer windings is 1. The data show an average difference in acoustic output of 34.9 dB when the control windings are suitably energised. This difference is substantially greater than can be obtained currently by other techniques. The operating frequency for this result is 3.2 kHz at a magnetic field strength of 3.0 T.

The theoretical curves of Eq. [7] are also plotted versus x in FIG. 3(a), by substituting $\theta = x/r_o$. The propagation constants used are k=8.042 and j=58.79 corresponding to $v_a$=0.342 kms$^{-1}$ and $v_s$=2.5 kms$^{-1}$ at f=3.2 kHz. The other constants chosen for best fit are $a_s$=60, $a_c$=750. The plate details were $\overline{d}$=0.11 and s=0.062. The plate thickness was 12 mm with a length L of 580 mm and l=550 mm.

We have also measured the acoustic output response for a different plate pair as a function of frequency f for the case where $\theta$=0 and $I_1$=$I_2$=10 A(p). The number of turns for each winding is 3. The phase $\phi$ was optimised at each point. These results are plotted in FIG. 4 for the cases that $\phi \cong 0$ (open triangles) and $\phi \cong \pi$ (solid triangles) and compared with the respective theoretical curves, Eq. [11]. The amplitude used for this fit is $b_c$=150. The value of Eq. [8] is arbitrarily set to unity in order to keep the theoretical log plot of FIG. 4(a) on the graph. The plate was cast from unfilled polyester/styrene with dimensions $\overline{d}$=0.11, s=0.0625, a plate thickness of 12 mm and length L of 580 mm and l=545 mm. For best fit $v_s$=1.57 kms$^{-1}$. The theoretical value of the sound velocity in polyester/styrene lies in the range 1.2–2.2 kms$^{-1}$.

Theoretical Improvements

The substantial difference in values of $a_s$ and $a_c$ required to fit the experimental data has led me to reconsider the details of the theory by recasting the analysis in terms of normal modes of vibration of the plate using wave analysis. In this case the wave excitation within the plate structure can be expanded in a Fourier series to give for the case $\phi=\pi$ $$F(x,k) = \sin kx = \sum_{n}^{\infty} a_n \sin(n\pi x/d), \quad [12]$$

and for the case $\phi=0$ $$G(x,k) = \cos kx = \sum_{m}^{\infty} b_o + b_m \cos(m\pi x/d), \quad [13]$$

where n=1, 3, 5 . . . , m =2, 4, 6 . . . , and where the coefficients are given by $$a_n = \frac{-2dk\cos(dk/2)}{d^2k^2 - n^2\pi^2} \quad [14]$$

and by $$b_m = \frac{-2dk\sin(dk/2)}{d^2k^2 - m^2\pi^2}. \quad [15]$$

The novel feature of this analysis not disclosed elsewhere to my knowledge is the appearance of the cosine and sine terms in $a_n$ and $b_m$. The ratio of the coefficients $a_n/b_m$ can be substantially greater than 1, especially for the initial terms which dominate the expansions. It can be shown for the experimental results contained here that for GRE 10 G/40 at 3.2 kHz and with v=3.5 kms$^{-1}$ the ratio $a_1/b_2$ is approximately equal to $a_c/a_s$=75/6=12.5. For the two dominant terms in Eqs. [12] and [13] we may now write $a_c \approx \alpha a_1$ and $a_s \approx \alpha b_2$. The experimental results can, therefore, now be explained using this theoretical approach with truncated expressions for F(k,x) and G(k,x), Eqs. [12] and [13], see FIG. 3(b).

The appearance of the term $b_o$ in Eq. [13] means that in the zeroth vibrational mode the plate surface is not deformed but of constant thickness therefore the surface does not radiate. In this situation acoustic waves will only be launched from the plate surface for terms corresponding to m =2,4 . . . As we have seen the amplitudes of these harmonics reduce rapidly with increasing m so that the acoustic output in the cancellation mode is dominated by $b_2$. However, when $b_2$ is very small another problem occurs which effectively controls the shape of the acoustic output function (open triangles of FIG. 3). This arises from $b_o$ by virtue of whole plate translation under the action of the applied forces, producing an enhanced acoustic radiation from the edges of the plate. It can be shown that the amplitude of the edge radiation due to translation, $a_e^T$, is given by $$a_e^T = 2F/(Ad\rho\omega^2) = 2Fd_K^2/4\pi^2 AE = a_e^V K^2, \quad [16]$$

where F is the Lorentz force applied by the wire at the plate edges, d is the width of the plate, A is the cross-sectional area of the plate edge and E is Young's Modulus. The term $a_e^V$ is the vibrational amplitude due to elastic displacements and the enhancement factor is $$K^2 = (\omega_o/\omega)^2 \quad [17]$$

in which $\omega_o$ is the fundamental angular resonance frequency of the plate and $\omega$ is the applied excitation angular frequency. This result means that the normal vibrational displacement of the edge is effectively amplified by a factor $K^2$ when in pure translation.

In the prior art I have described several methods which may be applied to reduce the acoustic radiation from the plate edges (P. Mansfield, UK Patent Application, 9920185 1999). However, in the present work I will introduce a new and possibly superior way of dealing with acoustic edge effects. This will be described hereinafter. I wish now to concentrate on further theoretical improvements in the description of the plate pair response.

Long Axis Vibration (Empirical Approach)

In our previous work we have ignored the length of the plates. This corresponds to the plane strain situation and effectively regards the plate as being infinitely long. For the first time we now consider the response involving vibrations along both the short axis and the long axis which for convenience we shall refer to as the x-axis and the y-axis respectively. In the uncoupled case using vibration analysis we have a pair of equations describing propagation within the solid. For propagation along the x-axis using the differential operator notation, we have $$(D^2 + qD - v_x^2 D_x^2)u_x(x,t) = (F_x/2\tau d\rho)e^{i\omega t} = f_x e^{i\omega t} \quad [18]$$

while for propagation along the y-axis we have $$(D^2 + qD - v_y^2 D_y^2)u_y(y,t) = (F_y/2\tau l\rho)e^{i\omega t} = f_y e^{i\omega t}, \quad [19]$$

where $u_x(x,t)$ and $u_y(y,t)$ are general displacements within the plate along the x- and y-axes and which henceforth will be referred to simply as $u_x$ and $u_y$, and where $D=\partial/\partial t$, $D_x=\partial/\partial x$, $D_y=\partial/\partial y$, $\rho$ is the plate density, l, d and $2\tau$ the length, width and thickness respectively, $q=\eta/\rho$ in which $\eta$ is the damping constant, assumed isotropic, $v_x$ and $v_y$ are the velocities of sound in the solid plate material along the x- and y-axes respectively, $F_x$ and $F_y$ are the Lorentz forces and $f_x$ and $f_y$ the specific Lorentz forces applied along the x- and y-axes respectively. Solutions of Eqs.[18] and [19], for q=0, give, in general, normal mode series for both $u_x$ and $u_y$. However, it is emphasised that using the principle of separation of variables, the solutions of Eqs.[18] and [19] may be represented as the products of a time-frequency dependent part and a spatial-k dependent part. Because there is now excitation along both the x- and y-axes, Eq. [12] is redefined along the x-axis as $$\sin kx = \sum_v a_v \sin(v\pi x/d) = \sum_v^\infty A_x^v(k,x)/(v^2\omega_{ox}^2 - \omega^2) \quad [20]$$

where $$A_x^v(k,x) = 2k\frac{v^2}{d}\cos(kd/2)\sin(v\pi x/d), \quad [21]$$

and redefined along the y-axis as $$\sin ky = \sum_\mu a_\mu \sin(\mu\pi y/l) = \sum_\mu^\infty A_y^\mu(k,y)/(\mu^2\omega_{oy}^2 - \omega^2) \quad [22]$$

where $$A_y^\mu(k,y) = 2k\frac{v^2}{l}\cos(kl/2)\sin(\mu\pi y/l). \quad [23]$$

Equations [21] and [23] are the spatial parts of the general solution of Eqs.[18] and [19]. The complete solutions are $$u_x^\mu = u_x^\mu(t,\omega)B_x^\mu(k,x) \quad [24]$$

and $$u_y^v = u_y^v(t,\omega)B_y^v(k,y) \quad [25]$$

where $$u_x^\mu(t,\omega) = \frac{f_x e^{i\omega t}}{\mu^2\omega_{ox}^2 - \omega^2} \quad [26]$$

with $$B_x^\mu(k,x) = K_\varepsilon A_x^\mu(k,x) \quad [27]$$

and with $\varepsilon = \bar{d}/2$, while $$u_y^v(t,\omega) = \frac{f_y e^{i\omega t}}{v^2\omega_{oy}^2 - \omega^2} \quad [28]$$

and $$B_y^v(k,y) = K_\varepsilon A_y^v(k,y) \quad [29]$$

with $\varepsilon = \bar{l}/2$. The term $K_\varepsilon$ is defined as $K_\varepsilon = e^{ik\varepsilon}$. The terms $u_x^\mu(t,\omega)$ and $u_y^v(t,\omega)$ from Eqs.[26] and [28] are effectively spatially normalised functions, henceforth referred to as $\tilde{u}_x^\mu$ and $\tilde{u}_y^v$ respectively.

Re-writing Eqs. [18] and [19] in terms of the spatially normalised functions and after substitution of the differential operators we obtain $$(\mu^2 \omega_{ox}^2 - \omega^2)\tilde{u}_x^\mu = f_x e^{i\omega t} \quad [30]$$

and $$(\nu^2 \omega_{oy}^2 - \omega^2)\tilde{u}_y^\nu = f_y e^{i\omega t} 1 \quad [31]$$

As they stand, Eqs.[30] and [31] are independent with no coupling between them. However, there will in general be small cross terms arising from the Poisson effect. We propose these terms be written in terms of the spatially normalised functions as $$\kappa \mu^2 \omega_{ox}^2 \tilde{u}_y^\nu \quad \text{and} \quad \kappa \nu^2 \omega_{oy}^2 \tilde{u}_x^\mu$$

in which $\kappa$ is the coupling constant. Our choice of spatially normalised functions, therefore, ensures that linear combinations of $$\tilde{u}_x^\nu \quad \text{and} \quad \tilde{u}_y^\nu$$

are dimensionally consistent. Adding in these new terms and substituting for the differential operators we find for the special case of odd harmonics that the new coupled equations are $$\sum_\mu \tilde{u}_x^\mu - \frac{\kappa \mu^2 \omega_{ox}^2 \tilde{u}_y^\nu}{\mu^2 \omega_{ox}^2 - \omega^2} = f_x e^{i\omega t} \sum_\mu 1/(\mu^2 \omega_{ox}^2 - \omega^2) \quad [32]$$

$$\sum_\nu \frac{-\kappa \nu^2 \omega_{oy}^2 u_x^\mu}{\nu^2 \omega_{oy}^2 - \omega^2} + \tilde{u}_y^\nu = f_y e^{i\omega t} \sum_\nu 1/(\nu^2 \omega_{oy}^2 \omega^2).$$

For $\mu = \nu = 1$ the lowest modes of vibration, Eqs.[32] reduce to $$(-\omega^2 + iq\omega + \omega_{ox}^2)\tilde{u}_x^1 - \kappa \omega_{ox}^2 \tilde{u}_y^1 = f_x e^{i\omega t} \quad [33]$$

and $$-\kappa \omega_{oy}^2 \tilde{u}_x^1 + (-\omega^2 + iq\omega + \omega_{oy}^2)\tilde{u}_y^1 = f_y e^{i\omega t} \quad [34]$$

where $\omega_{ox}$ and $\omega_{oy}$ are the fundamental plate resonances along the x- and y-axes respectively.

Equations [33] and [34] may be written in matrix form as $$M \begin{pmatrix} \tilde{u}_x^1 \\ \tilde{u}_y^1 \end{pmatrix} = \begin{pmatrix} f_x \\ f_y \end{pmatrix} e^{i\omega t} \quad [35]$$

From Eqs. [33] and [34] we may write M as $$m = \begin{pmatrix} m_{11} & m_{12} \\ m_{21} & m_{22} \end{pmatrix} \quad [36]$$

with matrix elements $$m_{11} = -\omega^2 + iq\omega + \omega_{ox}^2 \quad [37]$$

$$m_{12} = -\kappa \omega_{ox}^2 \quad [38]$$

$$m_{21} = -\kappa \omega_{oy}^2 \quad [39]$$

and $$m_{22} = -\omega^2 + iq\omega + \omega_{oy}^2 \quad [40]$$

Inverting Eq. [35] we find for the displacements $$\tilde{u}_x^1 = \frac{[m_{22} f_x - m_{12} f_y] e^{i\omega t}}{\text{Det } M} \quad [41]$$

and $$\tilde{u}_y^1 = \frac{[-m_{21} f_x + m_{11} f_y] e^{i\omega t}}{\text{Det } M} \quad [42]$$

where the determinant $$\text{Det } M = m_{11} m_{22} - m_{12} m_{21}. \quad [43]$$

Substituting the matrix elements we find for the case q=0 that $$\text{Det } M \approx [\omega^2 - \omega_{ox}^2 - a(\omega_{ox}^2 - \omega_{oy}^2)/4][\omega^2 - \omega_{oy}^2 + a(\omega_{ox}^2 - \omega_{oy}^2)/4] \quad [44]$$

where $$a = \frac{4\omega_{ox}^2 \omega_{oy}^2 \kappa^2}{(\omega_{ox}^2 - \omega_{oy}^2)^2}. \quad [45]$$

Substituting the matrix elements into Eqs.[41] and [42] and using Eqs.[24] and [25] we obtain the displacements $$u_x^1 = \frac{[\kappa \omega_{ox}^2 f_y - |\omega_{oy}^2 - \omega^2| f_x] B_x^1(k, x) e^{i\omega t}}{\text{Det } M} \quad [46]$$

and $$u_y^1 = \frac{[|\omega_{ox}^2 - \omega^2| f_y + \kappa \omega_{oy}^2 f_x] B_y^1(k, y) e^{i\omega t}}{\text{Det } M}. \quad [47]$$

Including the damping q in the determinant Det M' only we obtain $$DetM' \approx \sqrt{[\omega^2 - \omega_{ox}^2 - a(\omega_{ox}^2 - \omega_{oy}^2)/4]^2 + q^2\omega^2\}\{[\omega^2 - \omega_{oy}^2 + (\omega_{ox}^2 - \omega_{oy}^2)/4]^2 + q^2\omega^2\}} \quad [48]$$

which replaces Det M in Eqs.[46] and [47]. When $\kappa=0$, $u_x^1$ of Eq. [46] reduces to our previous result, Eq. [26]. This result shows that even though we are considering displacements along the x-axis, i.e. the short axis, the longitudinal y-axis response will appear in the x-axis response. This could be a useful feature if it were necessary to increase the x response at a particular frequency corresponding to the y resonance. Using the new normal mode theory the theoretical acoustic output response, $A_{SAP}^c(\theta)$, is given by $$A_{SAP}^c(\theta) = \quad [49]$$
$$K_3\omega\left[\int_{-s-\bar{d}/2}^{-s+\bar{d}/2} e^{ijx\sin\theta}\frac{d}{dx}(u_x^1)dx + \int_{+s-\bar{d}/2}^{+s+\bar{d}/2} e^{ijx\sin\theta}\frac{d}{dx}(u_x^1)dx\right].$$

When $\theta=0$, Eq. [49] reduces to $$A_{SAP}^c(0) = \frac{K_3\omega[2\kappa\omega_{ox}^2 f_y - 4|\omega_{oy}^2 - \omega^2|f_x]B_x^1(k,\bar{d}/2)\cos(\pi s/\bar{d})e^{i\omega t}}{Det\ M'} \quad [50]$$

where $$K_3 = e^{ijr_o}\left[\frac{4\sigma\tau}{r_o}\right]. \quad [51]$$

In the new empirical curve we can now account for the long axis plate resonance.

The above analysis is confined to the n=1 modes but also applies to higher frequency modes of the plate. For a complete and accurate description of all collective modes of vibration the analysis of the next subsection should be applied. Notwithstanding this, the results of this subsection suggest that in cancellation mode it would be appropriate to use effectively double mode quenching of both the x and y fundamental mode responses.

Collective Mode Analysis

The empirical analysis given above in essence cobbles together two one-dimensional solutions along the x- and y-axes to form a two-dimensional solution in the x,y-plane. The two one-dimensional solutions are coupled via the interaction term. The problem with this approach is that it is incapable of producing truly combined two-dimensional vibrational collective modes. It works well for low modal numbers along the x- or y-axis but it is well-known in the vibration analysis of plates that there are certain modes of vibration that act together to produce new eigenvalues which do not occur in the one-dimensional case that we have considered so far.

However, it is also emphasised that collective modes require congruous boundary conditions on all edges which may not exist at all or any frequency.

In an alternative approach we consider the modified wave equation in two dimensions. The two-dimensional forced vibration equation for our situation is given as $$(-v_x^2 D_x^2 - v_y^2 D_y^2 + D^2)u(x, y, t) = F_{ox,oy}e^{i\omega t}. \quad [52]$$

In this case the time-dependant perturbation is applied along both the x- and y-axes. The specific force is denoted $F_{ox,oy}$. In this situation the solution of the two-dimensional equation for displacements within the x,y-plane is $$u(x, y, t) = \sum_{o,o}^{g,h} c_{g,h}^{a,b}(k)^{\sin}_{\cos}(g\pi x/D)^{\sin}_{\cos}(h\pi y/L)F_{ox,oy}e^{i\omega t} \quad [53]$$

where the coefficients $$c_{g,h}^{a,b}$$

are given by $$c_{g,h}^{a,b}(k) = \frac{H(k, D, L)}{(\omega_{g,h}^2 - \omega^2)} \quad [54]$$

in which $\omega_{g,h}$ are the eigenvalues which represent the collective modes of vibration in two dimensions. The superscripts a,b take on the following meaning a=s or c and b=s or c where s and c refer to the sine or cosine combination used following the coefficient. This means there are four versions of the coefficient corresponding to the total number of combinations of the sine and cosine terms in Eq. [53]. Which modes are excited depends on the forces and their phases when applied to the plate edges. By similarity with the one-dimensional case, Eqs.[14] and [15], H(k,D,L) is derived from the two-dimensional Fourier components of the k-wave analysis. If the free vibration normal modes along the x- and y-axes are $\pi g/D$ and $\pi h/L$ respectively, where g and h are integers, the combined collective mode frequencies become $$\omega_{g,h} = \sqrt{v_x^2\left(\frac{\pi g}{D}\right)^2 + v_y^2\left(\frac{\pi h}{L}\right)^2}. \quad [55]$$

It is clear that when either $F_{ox}$ or $F_{oy}$ equals zero the response function will be identical to the one-dimensional cases already given in our previous analysis, Eq. [46]. In particular it will readily be seen that $c_{g,h}^{a,b}(k)$ reduces to either Eq. [14] or Eq. [15] depending on the excitation. In this alternative analysis no additional coupling between the x- and y-response is required and Eq. [55] applies equally to mixed mode situations where g and h are both non zero. For higher modes the response in the two-dimensional case would simply be the sum of all excited modes present in the plate, as expressed by Eq. [53].

Practical Embodiments

Double Mode Quenching

In the prior art we describe a split plate arrangement with an outer loop carrying current $I_1$ and an inner re-entrant loop carrying current $I_2 e^{i\Phi}$. When $\emptyset$ is close to or equal to zero, $I_1$ and $I_2$ are in phase and this corresponds to the cancellation mode. As described the cancelling currents are arranged to be along the x-edges of the plates. However, it is possible to arrange the wires so that they are driving in an appropriate manner the end edges of the plates, two versions of which are shown in FIG. 5. In the first version P,P' shows the inner loop extended to cover the ends of the plate P' producing cancellation or addition along the y-axis as well as normal operation along the x-axis. In an alternative arrangement Q,Q' substitutes for P,P' and again produces either cancellation or addition along the x-axis. In this alternative arrangement the cancellation currents are provided in a symmetric manner having the advantage of balancing the Lorentz forces along the y-axis. Such arrangements should further reinforce the major cancellation produced by quenching the n=1 mode along the x-axis.

Removal of Translational Motion in the Cancellation Mode

We shall restrict our discussion to the cancellation mode along the x-axis. We have seen that in the cancellation mode a term $b_o$ which is independent of x appears in the normal mode expansion for $G(x,k)$, Eq. [13]. We interpret this as a general displacement of all points within the plate assembly along the x-axis. In fact one can consider this to be a zeroth mode (n=0) of vibration and looked at this way all points within the plate receive a force acting on them instantaneously so that the plate as a whole moves along the x-axis. In practice this occurs because the Lorentz forces on both edges of the plate are acting in the same direction. As we have seen above the actual displacement of the plate can be calculated knowing the force, its time dependance, and the mass of the plate. This we have done to produce the result of Eq. [16]. To stop the plate moving along the x-axis it is simply not sufficient to apply an opposing force at one edge of the plate. Such a force would effectively squeeze the plate sending a new acoustic wave through the material and thereby vitiating the desired effect. The opposing force ideally should be applied in a distributed form throughout the body of the plate. This may be possible by reinforcing the plate appropriately with extremely strong columns of material such that opposing forces applied to the ends of the columns will be transmitted as rapidly as possible throughout the plate material. Of course the opposing forces cannot appear instantaneously at all points within the plate by virtue of the finite sound velocity within these columns. This will always be controlled by the velocity $v=\sqrt{(E/\rho)}$.

To understand how the new arrangement of plate and rods operates we consider first the split-plate arrangement of FIG. 7 without the ceramic rods. When $\emptyset=0$ the inner and outer loop currents, $I_2$, $I_1$ are in phase. The Lorentz forces, F, on conductors A and B are equal and opposite to the Lorentz forces–F on conductors C and D, thereby balancing each half of the split-plate assembly. The wave excitation within each half-plate is described by the normal mode expansion, Eq. [13], in which b. describes the bulk plate translation with no surface deformation and consequently no radiation from the plate surface. The terms $b_m$ with m=2, 4 . . . are responsible for surface deformations of the plate which produce the acoustic radiation output. Because the series expansion, Eq. [13], is fairly rapidly convergent, the acoustic output may be approximated by the leading term, $b_2$, producing an approximation for the reduced acoustic output. Similarly when $\emptyset=\pi$ the inner and outer loop currents, $I_2$, $I_1$, are in anti-phase. In this case the Lorentz forces, F, within each half-plate are equal and opposite, thus squeezing the plate material and thereby launching the wave excitation within the plate described by Eq. [12]. In this case the motion of each half-plate is symmetric about its centre. The wave within the plate is described by a rapidly convergent normal mode expansion which may be approximated by the leading term, $a_1$. The ratio, R, of reduced/full acoustic output may, therefore, be approximated by $$R=b_2/a_1. \qquad [56]$$

We now introduce the ceramic rods as indicated in FIG. 7. For the case $\emptyset=0$ the Lorentz force per unit length, F, of conductor A is effectively balanced by –F on conductor C when $I_1=I_2$. Similarly the force, F, on conductor B is effectively balanced by –F on conductor D. If the balance is perfect the net forces on all conductors are zero and, therefore, no acoustic radiation is produced from either the plate surfaces or the edges. However, when $\emptyset=\pi$, the force on conductor B is reversed and is now equal and opposite to that on conductor A. Similarly for the forces on C and D. These forces squeeze each half of the plate assembly producing the full acoustic output.

In practice for $\emptyset=0$ the forces do not exactly balance because of the elastic properties of the rods. Let the effective force on each plate edge be $F'=\alpha F$ where $0 \leq \alpha \leq 1$. Plate translation and hence edge radiation is greatly reduced. We now have a new ratio of reduced/full acoustic output on the plate surface, R', given approximately by $$R'=\alpha b_2/a_1. \qquad [57]$$

This means that for $\alpha<1$ there is a further improvement in acoustic reduction efficacy. All the above follows if the edge conductors remain straight and parallel during the excitation process. To ensure this is the case the plate edges and conductors must be as stiff as practicable in order to minimise droop between the rods. This is discussed in greater detail below.

The materials that might form the columns in the above described arrangement could be ceramics like Corundum ($Al_2O_3$), Zirconium Oxide, Silicon Nitride, Silicon Carbide, Tungsten Carbide or carbon fibre reinforced epoxy (CRE) rods. In the case of Corundum the typical velocity of sound is in excess of 9 $kms^{-1}$. Similarly high sound velocities may be expected for aligned carbon fibre rods. Somewhat lower but useful velocities may be expected for aligned glass fibre rods set in epoxy, also known as GRE pultrusions. Although these materials are expensive, in the arrangement proposed very little material is used, thereby keeping costs low. If the bulk of the plate is made of a weaker and much cheaper material such as moulded acrylic sheet or moulded polyester/styrene sheet where the typical velocity of sound is approximately 1.5 $kms^{-1}$, the rods or columns could approximate well to near instantaneous delivery of the opposing Lorentz forces throughout the body of the plate. The physical arrangement visualised corresponds to an inter-digitated strut/tie assembly as shown in FIG. 6. The advantage of this arrangement is that in cancellation mode the relevant wires are effectively coupled together through the rods or columns by the shortest route that ensures that all rods are the same length. In this particular embodiment we visualise that the plate material is drilled to take the columns which are stuck in and which physically touch the wires. The coupling of the rods to the inner loop conductor may include a small pad which also acts as a load spreader. The rods or columns may also be moulded, cast or potted into the plastic plate assembly.

In a further embodiment shown in FIG. 7 the columns of ceramic material pass through the body of the plates but in one embodiment do not touch the plates. The plates have edge caps made of a much stronger and stiffer material, possibly GRE 10G/40 or CRE, which serve to spread the loads and the ceramic columns are arranged to make contact with the edge caps which support the plate wires as shown. In this arrangement no substantial force is transmitted to the plate material in the cancellation mode so that no squeezing or bulk translation of the plate occurs, whereas in the additive mode the full equal and opposite Lorentz forces are transmitted to the sandwiched plate material producing acoustic output in the fundamental vibration mode. In this arrangement the outer conductor carrying current, $I_1$, and the inner conductor carrying current, $I_2 e^{i\Theta}$, are either embedded in or fastened to or glued to the edge capping material. In both this arrangement and that described in FIG. 6 further modifications along the lines described in FIG. 5 may be additionally introduced in order to quench vibration along the y-axis.

The advantage of the arrangement of FIG. 7 is that propagation times within the columns are equal, the plate assembly operates correctly in the switched mode giving very large outputs in the additive mode and very low outputs in the cancellation mode. The further advantage is that in the cancellation mode there is substantially no squeezing or translational motion of the plate so that the n=2 mode and higher even modes are weakly excited.

In a further embodiment of the arrangement shown in FIG. 7 the ceramic rods may be glued into the plates, thereby transmitting the cancellation force uniformly through the body of the plate. An alternative to gluing into machined holes is to cast the plastic resin into sheet form with the rods in situ. This would reduce fabrication costs.

Residual unwanted acoustic radiation from the plate edges may be reduced by the methods described in the prior art (P. Mansfield, UK Patent Application, 9920185 1999).

Gradient Coil Sets

The above results pertain to rectangular plate-pair sections. A typical four sector arrangement of plate-pairs is shown in FIG. 8 and can be used to produce an x-, y- or a z-gradient. It is emphasised that gradient coils can be generated from the basic arrangement of FIG. 8 using multi-plate stacks to generate all three orthogonal axes, $G_x$, $G_y$ and $G_z$, thereby improving gradient linearity. Stacking plates may affect the overall acoustic efficacy of the gradient coils. If sound levels increase additional sound absorbing material may be interleaved between the plates (P. Mansfield, U.S. Pat. No. 5,990,680 Nov. 23, 1999, Priority Date Apr. 1, 1995).

It is emphasised that a gradient coil constructed with rectangular sectors may not be the most efficient design in terms of gradient strength per Ampere-turn. A more efficient approach using the principles of active acoustic control together with the plate design principles described in this work may be visualised using arcuate sectors (P. Mansfield, U.S. Pat. No. 5,990,680, Nov. 23, 1999, Priority Date Apr. 1, 1995). The same design principles disclosed in this work may also be applied to cylindrical coils employing distributed conductor plates of the fingerprint design (P. Mansfield, U.S. Pat. No. 5,990,680, Nov. 23, 1999, Priority Date Apr. 1, 1995). I have concentrated on rectangular geometry simply because it ensures a relatively straightforward mathematical analysis of acoustic propagation in the solid plate material supporting the wires.

Further Embodiments

Figure 9A:
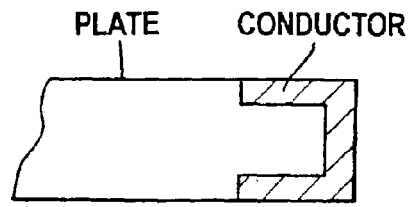
Figure 9B:
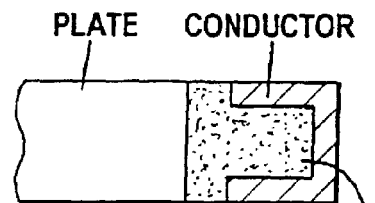
Figure 9C:
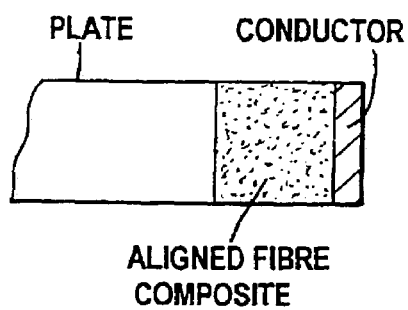
Figure 9D:
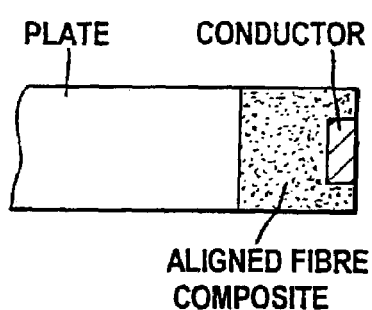
Figure 9E:
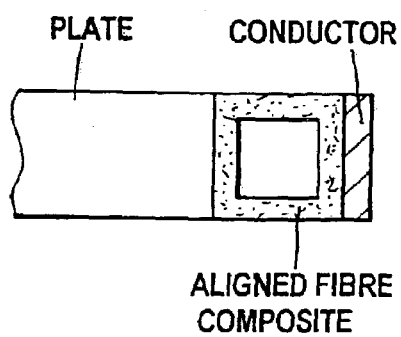
Figure 9F:
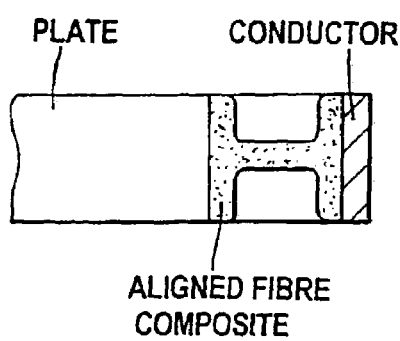

So far we have discussed the arrangement of edge stiffening whereby the conductor is added separately. However, we now propose that the stiffening at the plate edges could be produced by the conductor itself if it were sufficiently strong. In order to increase the stiffness it would further be possible to shape the conductor in the form of a U-section or similar section, adding considerable stiffness to the structure as described in FIGS. 6 and 7. FIGS. (9a–f) shows a number of plate edge stiffening arrangements in which either the conductor itself is shaped or the edge is stiffened with aligned fibre composites and on which the conductor is added. The fibre composites could include epoxy single glass fibre bundles running the length of the plate edge or epoxy single carbon fibre bundles. In the latter case it would, in general, be necessary to add some insulation between the carbon fibre composite and the conductor since the carbon fibre composite is itself a conductor. Although FIGS. (9c–f) show the conductor as a flat strip mounted on the aligned fibre composite edge stiffener, it would clearly be possible to shape the conductor in the form of a U-section or other section to give additional stiffening. If the conductors alone form the edge stiffening as in FIG. 9(a), then the rods would be fixed, screwed or cemented directly into the conductor stiffening edges. Otherwise the rods would be fixed, screwed or cemented into the aligned fibre composite material.

The rod spacing as indicated in FIGS. 6 and 7 could be decreased to prevent droop or inward or outward bowing of the edge stiffening conductors between the rods. The spacing of adjacent rods should be decreased to the point where there is effectively no droop. This spacing would, of course, depend on the degree of edge stiffening.

Although we have concentrated somewhat on the use of ceramic rods as in FIGS. 6 and 7, we emphasise that in the situation described by FIG. 9 where edge stiffeners comprising aligned fibre composites are used in addition to possibly shaping the conductor, it is possible to use other rod materials some of which may be conducting materials provided that the rods do not touch the edge conductors. In this situation it would be preferable to use non-conducting aligned fibre composites such as epoxy single glass fibre bundles. However, it may be the case that rods made of aligned single carbon fibre bundles in an epoxy resin would be as good or even superior to ceramic rods. In this case the rods would be insulated from the edge conductors.

New Embodiments

In general there will be other modes of vibration of the plate which we have hitherto ignored. These modes comprise torsional vibrational modes and bending and flexing modes or Chladni modes. Our assumption in ignoring these modes is that with careful machining they can largely be avoided. In general this is true and our experience to date is that they produce a relatively small effect. However, it is not negligible and in order to further reduce the effect of, for example, Chladni resonances, the length of the plate structure, L, can be split into L/n non-contiguous sub-units, n integer. The effect of doing this is to push up the lowest Chladni resonance to a frequency which is $n^2$ times the fundamental Chladni resonance of the unsplit plate. Similar arguments apply to the edge stiffeners. To maintain the integrity of the plate assembly and electrical continuity flexible copper braid can be used where appropriate and a softer flexible material can be used to join the plate sections where necessary. Adding in soft flexible material, will, of course, produce low frequency Chladni resonances but the object here would be to create clear resonant mode windows in which the compressional response behaviour of the plate can operate in an unhindered and unperturbed manner.

DISCUSSION AND CONCLUSIONS

The experimental data were obtained at a distance $r_o=1.2$ m from the acoustic plates. However, the theoretical expressions used to fit these data correspond to the far field situation and it is, therefore, gratifying to see such good agreement between the improved theory and experiment. The discrepancies observed in FIG. 3($a$) may in part be due to the difference between the far field and near field calculation and should, therefore, be explored. Improved fit to the new theory, FIG. 3($b$), however suggests that the differences between far and near field are quite small. Although the values of current, $I_1$ and $I_2$, used to obtain the experimental data are equal the new theory shows that the two amplitudes, $a_s$ and $a_c$ corresponding respectively to $\phi=0$ and $\phi=\pi$ are not equal. Using a common scaling factor for both curves together with the theoretical values of $F(k,x)$ for n=1, 3 and 5, and $G(k,x)$ for m=2, 4 and 6 an excellent fit of the data is obtained which shows a very substantial reduction in acoustic noise output when using the control winding.

With no rods the observed acoustic noise output can be characterised approximately by the ratio of reduced/full output, R, given by Eq. [56] in which $b_2$ and $a_1$ are respectively the amplitudes of the second and first normal mode harmonics of the plate along its short axis.

If rods are added the new ratio, R', is given approximately by Eq. [57] where $\alpha F=F'$ is a measure of the effective force applied at the plate edges due to the presence of the rods. The factor $\alpha$ will in general lie in the range $0 \leq \alpha \leq 1$ and will depend on the applied frequency, the elastic properties of the rods as well as the plate and rod dimensions.

The invention claimed is:

1. An acoustically quiet MRI coil design including a magnetic coil system comprising:
    an outer coil loop carrying a first current and an inner coil loop carrying a second current, wherein: a first portion of the outer coil loop and a first portion of the inner coil loop are embedded in, or fixed to, a first block of first material of generally rectangular or arcuate shape with predetermined acoustic characteristics;
    a second portion of the outer coil loop and a second portion of the inner coil loop are embedded in, or fixed to, a second block of said first material generally of rectangular or arcuate shape;
    said first and second blocks of material are separated by connecting flexible joints, said outer and inner coil loops comprise generally rectangular or arcuate paths, the second portion of said inner coil loop being positioned in order to create a first force when energized with said second current which counteracts or assists a second force generated by said first portion of said outer coil when energized with said first current, said forces being transmitted by columns, struts or ties rigidly connecting said second portion of said inner coil loop to said first portion of said outer coil loop;
    the first portion of said inner coil loop being positioned in order to create a third force when energized with said second current which counteracts or assists a fourth force generated by said second portion of said outer coil when energized with said first current, said forces being transmitted by columns, struts or ties rigidly connecting said first portion of said inner coil loop to said second portion of said outer coil loop, and the first and second portions of the inner and outer coil loops being formed substantially rigid.

2. A method of producing an acoustically quiet MRI coil design comprising:
    providing a first surface conductor portion and a second surface conductor portion on opposing surfaces of a first block of material, and a third surface conductor portion and a fourth surface conductor portion on opposing surfaces of a second block of material, the second surface conductor portion being adjacent to and facing the third surface conductor portion, wherein said first and second blocks of material are separated by connecting flexible joints;
    forming each of said surface conductor portions to be substantially completely rigid; and
    physically connecting said second surface conductor portion of said first block to said fourth surface conductor portion of said second block and said first surface conductor portion of said first block to said third surface conductor portion of said second block by means of rigid columns, struts or ties, to form a substantially rigid acoustically quiet coil structure.

3. An acoustically quiet coil as claimed in claim 1 in which said surface conductor portions are formed from a shaped conductor formed in combination with a shaped non-conducting material.

4. A method of providing an acoustically quiet coil design for MRI including a magnetic coil system consisting of at least four sectors, each sector comprising:
    an outer coil loop carrying a first current and an inner coil loop carrying a second current, wherein:
    a first portion of the outer coil loop and a first portion of the inner coil loop are embedded in, or fixed to, a first block of first material of generally rectangular or arcuate shape with predetermined acoustic characteristics;
    a second portion of the outer coil loop and a second portion of the inner coil loop are embedded in, or fixed to, a second block of said first material generally of rectangular or arcuate shape;
    said first and second blocks of material are separated by connecting flexible joints;
    said outer and inner coil loops comprise generally rectangular or arcuate paths;
    the second portion of said inner coil loop is positioned to create a first force when energized with said second current that either counteracts, or assists, a second force generated by said first portion of said outer coil loop when energized with said first electric current, said forces being transmitted by columns, struts or ties rigidly connecting said second portion of said inner coil loop to said first portion of said outer coil loop;
    the first portion of said inner coil loop is positioned to create a third force when energized with said second current to counteract, or to assist, a fourth force generated by said second portion of said outer coil loop when energized with said first current, said forces being transmitted by columns, struts or ties rigidly connecting said first portion of said inner coil loop to said second portion of said outer coil loop; and
    the first and second portions of the inner and outer coil loops are formed to be substantially rigid.

5. A method of designing an acoustically quiet coil as claimed in claim 4 in which the wave propagation at a distance x within the first material is described by $$F(x, k) = \sin kx = \sum_{n}^{\infty} a_n \sin(m\pi x/d),$$

for the case where $\phi \approx \pi$, and $$G(x, k) = \cos kx = \sum_{m}^{\infty} b_o + b_m \cos(m\pi x/d),$$

for the case $\phi \approx 0$,
where n=1, 3, 5 . . . , m=2, 4, 6 . . . , and where the coefficients are given by $$a_n = \frac{-2dk\cos(dk/2)}{d^2k^2 - n^2\pi^2}$$

and $$b_m = \frac{-2dk\sin(dk/2)}{d^2k^2 - m^2\pi^2}$$

where k is the wave propagation constant in the first material, d is the distance traveled by the wave in the first material, $b_0$=sinc(kd/2) and $\phi$ is the relative phase of the first and second currents in the outer and inner conductors respectively, said above equations quantifying the amount of noise reduction resulting from the structure as claimed in claim 4 when the relative phase $\phi$ between the first and second excitation currents is zero.

6. A method of designing an acoustically quiet coil as claimed in claim 5 wherein the approximate reduction in acoustic noise output is described by $$R = b_2/a_1$$

and in which when the columns, struts or ties are introduced the new ratio of reduced to full acoustic output in the block of first material is given by $$R' = \alpha b_2/a_1$$

where the effective force on each block edge is given by $F' = \alpha F$ where $0 \leq \alpha \leq 1$ and where F is the Lorentz force created by the conductor when energized with no columns, struts or ties present.

7. A method of providing an acoustically quiet coil design for MRI including a magnetic coil system consisting of at least four sectors, each sector comprising:

an outer coil loop carrying a first current and an inner coil loop carrying a second current, wherein: a first portion of the outer coil loop and a first portion of the inner coil loop are embedded in, or fixed to, a first block of first material of generally rectangular or arcuate shape with predetermined acoustic characteristics;

a second portion of the outer coil loop and a second portion of the inner coil loop are embedded in, or fixed to, a second block of said first material generally of rectangular or arcuate shape;

said first and second blocks of material are separated by connecting flexible joints;

said outer and inner coil loops comprise generally rectangular or arcuate paths;

the second portion of said inner coil loop is positioned to create a first force when energized with said second currents either to counteract or assist a second force generated by said first portion of said outer coil loop when energized with said first current, said force being transmitted by columns, struts or ties rigidly connecting said second portion of said inner coil loop to said first portion of said outer coil loop;

the first portion of said inner coil loop is positioned to create a third force when energized with said second current to counteract or to assist a fourth force generated by said second portion of said outer coil when energized with said first current, said forces being transmitted by columns, struts or ties rigidly connecting said first portion of said inner coil loop to said second portion of said outer coil loop; and the first and second portions of the inner and outer coil loops are formed to be substantially rigid.

* * * * *